United States Patent [19]

Naya et al.

[11] Patent Number: 5,278,869
[45] Date of Patent: Jan. 11, 1994

[54] OPTICAL WAVELENGTH CONVERTING APPARATUS

[75] Inventors: Masayuki Naya, Shizuoka; Yoji Okazaki, Kanagawa, both of Japan

[73] Assignee: Fuji Photo Film Co., Ltd., Kanagawa, Japan

[21] Appl. No.: 921,119

[22] Filed: Jul. 29, 1992

[30] Foreign Application Priority Data

Jul. 30, 1991 [JP] Japan ................. 3-189890

[51] Int. Cl.⁵ .......................... H01S 3/13
[52] U.S. Cl. ........................ 372/29; 372/22; 372/31; 359/328
[58] Field of Search ............ 372/29, 31, 44, 22, 372/96; 359/328

[56] References Cited

U.S. PATENT DOCUMENTS

| | | | |
|---|---|---|---|
| 5,099,486 | 3/1992 | Acharekar et al. | 372/29 |
| 5,130,996 | 7/1992 | Amano et al. | 372/22 |
| 5,142,542 | 8/1992 | Dixon | 372/22 |

OTHER PUBLICATIONS

Applied Physics Letter, vol. 50, No. 24, Jun. 15, 1987, p. 1713.
"Laser. Atomic Oscillator and Extreme Photon Engineering", Symposium, promoted by the Japan Society of Applied Physics, Jan. 1990, p. 38.

*Primary Examiner*—Rodney B. Bovernick
*Assistant Examiner*—Robert E. Wise
*Attorney, Agent, or Firm*—Sughrue, Mion, Zinn, Macpeak & Seas

[57] ABSTRACT

An optical wavelength converting apparatus comprises a semiconductor laser, which is capable of oscillating in a multiple longitudinal mode, and an external resonator for resonating a laser beam, which has been radiated out of the semiconductor laser and which serves as a fundamental wave. An optical wavelength converting device is located in an optical path of the fundamental wave, which has been resonated by the external resonator. A device feeds part of the fundamental wave, which has been resonated by the external resonator, back to the semiconductor laser. A wavelength-converted wave in a single longitudinal mode is thereby obtained, which wave has a high intensity and is stable.

6 Claims, 2 Drawing Sheets

OPTICAL WAVELENGTH CONVERTING APPARATUS

BACKGROUND OF THE INVENTION

1. Field of the Invention

This invention relates to an optical wavelength converting apparatus for converting a laser beam, which serves as a fundamental wave, into its second harmonic, or the like. This invention particularly relates to an optical wavelength converting apparatus, wherein a semiconductor laser is utilized as a light source for producing a fundamental wave.

2. Description of the Prior Art

Various attempts have heretofore been made to convert the fundamental wave of a laser beam into its second harmonic, or the like, e.g. to shorten the wavelength of a laser beam, by using a nonlinear optical material. In such techniques, semiconductor lasers are often utilized as light sources for producing fundamental waves, which are to be converted into their second harmonics, or the like.

The laser beam, the wavelength of which has been shortened, is often utilized in a color laser printer, an optical pickup device, or the like. In many cases, it is desired that the laser beam be generated in a single longitudinal mode. Some of semiconductor lasers, which are utilized as light sources for producing fundamental waves, generate laser beams in the single longitudinal mode. The requirement described above can be satisfied by using such semiconductor lasers.

However, in general, semiconductor lasers, which generate laser beams in the single longitudinal mode, exhibit only a low level of output power. Therefore, in cases where such semiconductor lasers are used, a wavelength-converted wave having a high output power cannot be obtained.

On the other hand, various semiconductor lasers, such as broad area lasers and phased array lasers, have heretofore been proposed which generate laser beams in a multiple longitudinal mode and which can exhibit a high output power. Also, as described in, for example, Appl. Phys. Lett., Vol. 50, No. 24,15, June 1987, p. 1713, a technique has been proposed wherein a laser beam produced in a single longitudinal mode is injected into a semiconductor laser capable of oscillating in a multiple longitudinal mode, and a laser beam having the same wavelength as the injected laser beam is thereby obtained from the semiconductor laser capable of oscillating in the multiple longitudinal mode. Such a technique is referred to as injection locking. It is considered to apply such a technique to multiple-longitudinal-mode semiconductor lasers, which are used as light sources for producing fundamental waves.

However, in cases where the aforesaid injection locking technique is applied to multiple-longitudinal-mode semiconductor lasers, which are used as light sources for producing fundamental waves, the problems described below often occur. Specifically, the wavelength of the laser beam, which is generated by the semiconductor laser for injection locking, fluctuates. Therefore, the wavelength of the laser beam, which is generated by the multiple-longitudinal-mode semiconductor laser, also fluctuates. As a result, the intensity of the wavelength-converted wave cannot be kept stable.

SUMMARY OF THE INVENTION

The primary object of the present invention is to provide an optical wavelength converting apparatus, wherein a wavelength-converted wave in a single longitudinal mode can be obtained, which wave has a high intensity and is stable.

The present invention provides a first optical wavelength converting apparatus comprising:
i) a semiconductor laser, which is capable of oscillating in a multiple longitudinal mode,
ii) an external resonator for resonating a laser beam, which has been radiated out of said semiconductor laser and which serves as a fundamental wave,
iii) an optical wavelength converting device located in an optical path of the fundamental wave, which has been resonated by said external resonator, and
iv) a means for feeding part of said fundamental wave, which has been resonated by said external resonator, back to said semiconductor laser.

The present invention also provides a second optical wavelength converting apparatus comprising:
i) a semiconductor laser, which is capable of oscillating in a multiple longitudinal mode,
ii) an external resonator for resonating a laser beam, which has been radiated out of said semiconductor laser and which serves as a fundamental wave,
iii) an optical wavelength converting device located in an optical path of the fundamental wave, which has been resonated by said external resonator,
iv) a single-longitudinal-mode semiconductor laser for producing a laser beam for injection locking, which impinges upon said semiconductor laser capable of oscillating in the multiple longitudinal mode, and
v) a means for feeding part of said fundamental wave, which has been resonated by said external resonator, back to said single-longitudinal-mode semiconductor laser.

With the first optical wavelength converting apparatus in accordance with the present invention, the semiconductor laser, such as a broad area laser or a phased array laser, which is capable of oscillating in the multiple longitudinal mode and which exhibits a high output power, is utilized as a light source for producing the fundamental wave. Part of the fundamental wave, which has been resonated by the external resonator, is fed back to the semiconductor laser serving as the light source for producing the fundamental wave. Therefore, the oscillation frequency of the semiconductor laser, which is capable of oscillating in the multiple longitudinal mode, is brought to the resonance frequency of the external resonator, and the semiconductor laser is thereby caused to oscillate in the single longitudinal mode. Also, because the oscillation frequency of the semiconductor laser is locked at the resonance frequency of the external resonator, which exhibits a narrow frequency band, the wavelength of the fundamental wave, which has been brought to the single longitudinal mode, can be prevented from fluctuating.

Also, because the semiconductor laser, such as a broad area laser or a phased array laser, which is capable of oscillating in the multiple longitudinal mode, is utilized as a light source for producing the fundamental wave, a fundamental wave having a high output power can be irradiated to the optical wavelength converting device.

As described above, with the first optical wavelength converting apparatus in accordance with the present invention, a wavelength-converted wave in the single longitudinal mode can be obtained, which wave has a high intensity and is stable.

Feeding part of a fundamental wave, which has been resonated by an external resonator of a semiconductor laser, back to the light source for producing the fundamental wave is described in, for example, Collected Drafts for "Laser. Atomic Oscillator and Extreme Photon Engineering" Symposium, promoted by The Japan Society of Applied Physics, et al., 1990, page 38. However, with this conventional technique, a single-longitudinal-mode semiconductor laser is used as the light source for producing the fundamental wave, and the purpose of the light feedback is only to prevent fluctuations of the wavelength of the fundamental wave generated by the single-longitudinal-mode semiconductor laser. The optical wavelength converting apparatus in accordance with the present invention is clearly different from the conventional technique in the structure and the purpose of the light feedback.

With the second optical wavelength converting apparatus in accordance with the present invention, the laser beam, which has been generated by the single-longitudinal-mode semiconductor laser, is injected into the semiconductor laser, which serves as the light source for producing the fundamental wave. The so-called "injection locking" is thereby effected, and the light source for producing the fundamental wave is caused to oscillate in the single longitudinal mode.

Also, with the second optical wavelength converting apparatus in accordance with the present invention, part of the fundamental wave, which has been resonated by the external resonator, is fed back to the single-longitudinal-mode semiconductor laser for injection locking. Therefore, the oscillation frequency of the single-longitudinal-mode semiconductor laser is locked at the resonance frequency of the external resonator, which exhibits a narrow frequency band. Accordingly, the wavelength of the laser beam for injection locking does not fluctuate. As a result, the wavelength of the fundamental wave, which has been brought to the single longitudinal mode, can be prevented from fluctuating.

Additionally, with the optical wavelength converting apparatus in accordance with the present invention, the semiconductor laser, such as a broad area laser or a phased array laser, which is capable of oscillating in the multiple longitudinal mode, is utilized as the light source for producing the fundamental wave, a fundamental wave having a high output power can be irradiated to the optical wavelength converting device.

As described above, with the second optical wavelength converting apparatus in accordance with the present invention, a wavelength-converted wave in the single longitudinal mode can be obtained, which wave has a high intensity and is stable.

DESCRIPTION OF THE PREFERRED EMBODIMENTS

The present invention will hereinbelow be described in further detail with reference to the accompanying drawings.

Figure 1:
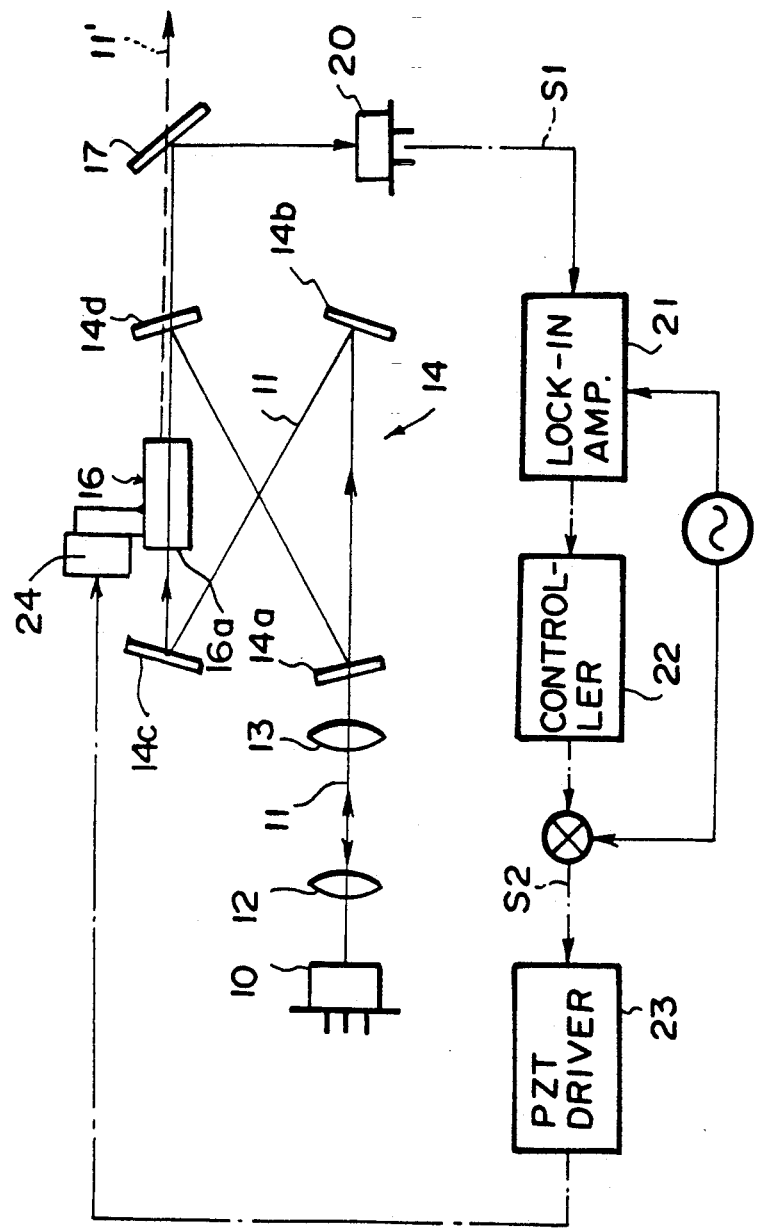
FIG. 1 is a schematic side view showing a first embodiment of the optical wavelength converting apparatus in accordance with the present invention.

FIG. 1 shows a first embodiment of the optical wavelength converting apparatus in accordance with the present invention. In this embodiment, a broad area laser 10, which can oscillate in a multiple longitudinal mode, is employed as a light source for producing a fundamental wave. The output power of the broad area laser 10 is 1W. When no specific operation is given to the drive of the broad area laser 10, i.e. when the broad area laser 10 is in the so-called "free running" state, the broad area laser 10 has a plurality of longitudinal modes over a wavelength range of 859 nm to 861 nm. The broad area laser 10 produces a laser beam 11, which serves as a fundamental wave. The laser beam 11 is collimated by a collimator lens 12, passes through a condensing lens 13, and then impinges upon a ring resonator 14.

The ring resonator 14 serves as an external resonator for the broad area laser 10. The ring resonator 14 comprises a mirror 14a for partially transmitting the fundamental wave 11, and mirrors 14b, 14c, and 14d for totally reflecting the fundamental wave 11. The fundamental wave 11, which has passed through the mirror 14a for partially transmitting the fundamental wave 11, is sequentially reflected by the mirror 14b, the mirror 14c, and the mirror 14d, and then impinges upon the mirror for partially transmitting the fundamental wave 11. The fundamental wave 11 is then reflected by the mirror 14a for partially transmitting the fundamental wave 11, and thereafter follows the same optical path as that described above. Specifically, the length of the optical path from the reflection by the mirror 14a for partially transmitting the fundamental wave 11 to the return to the mirror 14a constitutes the resonator length. The fundamental wave 11 resonates with an intrinsic resonance frequency (i.e., with a resonance wavelength), which is determined by the resonator length.

Also, a crystal 16 of $KNbO_3$, which is a nonlinear optical material, is located in the optical path of the fundamental wave 11 between the mirror 14c and the mirror 14d. The fundamental wave 11, the power of which has been increased in the resonator 14, is condensed by the condensing lens 13 and converged in the $KNbO_3$ crystal 16. The fundamental wave 11 is converted by the $KNbO_3$ crystal 16 into its second harmonic 11', the wavelength of which is one half of the fundamental wave 11, i.e., is 430 nm. The mirror 14d is provided with a coating film, which transmits approximately 100% of the second harmonic 11' and slightly transmits the fundamental wave 11. The fundamental wave 11 and the second harmonic 11', which have passed through the mirror 14d, impinge upon a dichroic mirror 17.

The fundamental wave 11, which has been resonated and then impinges upon the $KNbO_3$ crystal 16 in the manner described above, impinges upon an entry end face 16a of the $KNbO_3$ crystal 16 from the direction normal thereto. Part of the fundamental wave 11 is reflected by the entry end face 16a. The fundamental wave 11, which has thus been reflected by the entry end face 16a, is then reflected by the mirrors 14c and 14b, passes through the mirror 14a for partially transmitting the fundamental wave 11, and is thus fed back to the broad area laser 10. In this manner, in this embodiment, the means for feeding part of the fundamental wave 11, which has been resonated by the external resonator, back to the broad area laser 10 is constituted of the entry end face 16a of the KNbO$_3$ crystal 16, and the mirrors 14c and 14b. As part of the fundamental wave 11 is thus fed back, the oscillation frequency of the broad area laser 10 is brought to the resonance frequency of the ring resonator 14, and the fundamental wave 11 is brought to the single longitudinal mode. In this embodiment, the frequency band of the fundamental wave 11, which has been brought to the single longitudinal mode, becomes approximately 100 MHz or less, and its wavelength becomes 860 nm.

The fundamental wave 11, which has been brought to the single longitudinal mode in the manner described above, impinges upon the KNbO$_3$ crystal 16. Therefore, the second harmonic 11' is also obtained in the single longitudinal mode. Also, as the broad area laser 10 having an output power of 1W is employed as the light source for producing the fundamental wave 11, a second harmonic 11' can be obtained which has a higher intensity than when a semiconductor laser working in a single longitudinal mode is employed as the light source for producing the fundamental wave 11. In this embodiment, the output power of the second harmonic 11' is 300 mW. Also, as the oscillation frequency of the broad area laser 10 is brought to the resonance frequency of the ring resonator 14 having a narrow frequency band, the wavelength of the fundamental wave 11, which has been brought to the single longitudinal mode, can be prevented from fluctuating. Accordingly, a second harmonic 11' having a stable intensity can be obtained.

The dichroic mirror 17 transmits the second harmonic 11' and reflects the fundamental wave 11. In this embodiment, particularly, the fundamental wave 11, which has thus been reflected by the dichroic mirror 17, is detected for the purposes of carrying out a control operation for stabilizing the feedback of part of the fundamental wave 11 to the broad area laser 10. Specifically, the intensity of the fundamental wave 11, which has been reflected by the dichroic mirror 17, is detected by a photodetector 20, which generates a light intensity detection signal S1. The light intensity detection signal S1 is then fed into a lock-in amplifier 21 for carrying out phase detection and is then fed into a controller 22. The KNbO$_3$ crystal 16 is moved by a PZT device 24 in the optical axis direction, i.e., in the direction such that the length of the optical path up to the broad area laser 10 may be changed. The PZT device 24 is driven by a PZT driver 23.

The controller 22 feeds a drive control signal S2 into the PZT driver 23 and thereby controls the PZT device 24 such that the value of the light intensity detection signal S1 may become minimum. As a result, the length of the optical path from the entry end face 16a of the KNbO$_3$ crystal 16 to the broad area laser 10 is controlled such that a standing wave having the maximum intensity may occur in the composite resonator, which is composed of the ring resonator 14 and the internal resonator of the broad area laser 10. The feedback of part of the fundamental wave 11 to the broad area laser 10 is thereby stabilized.

Figure 2:
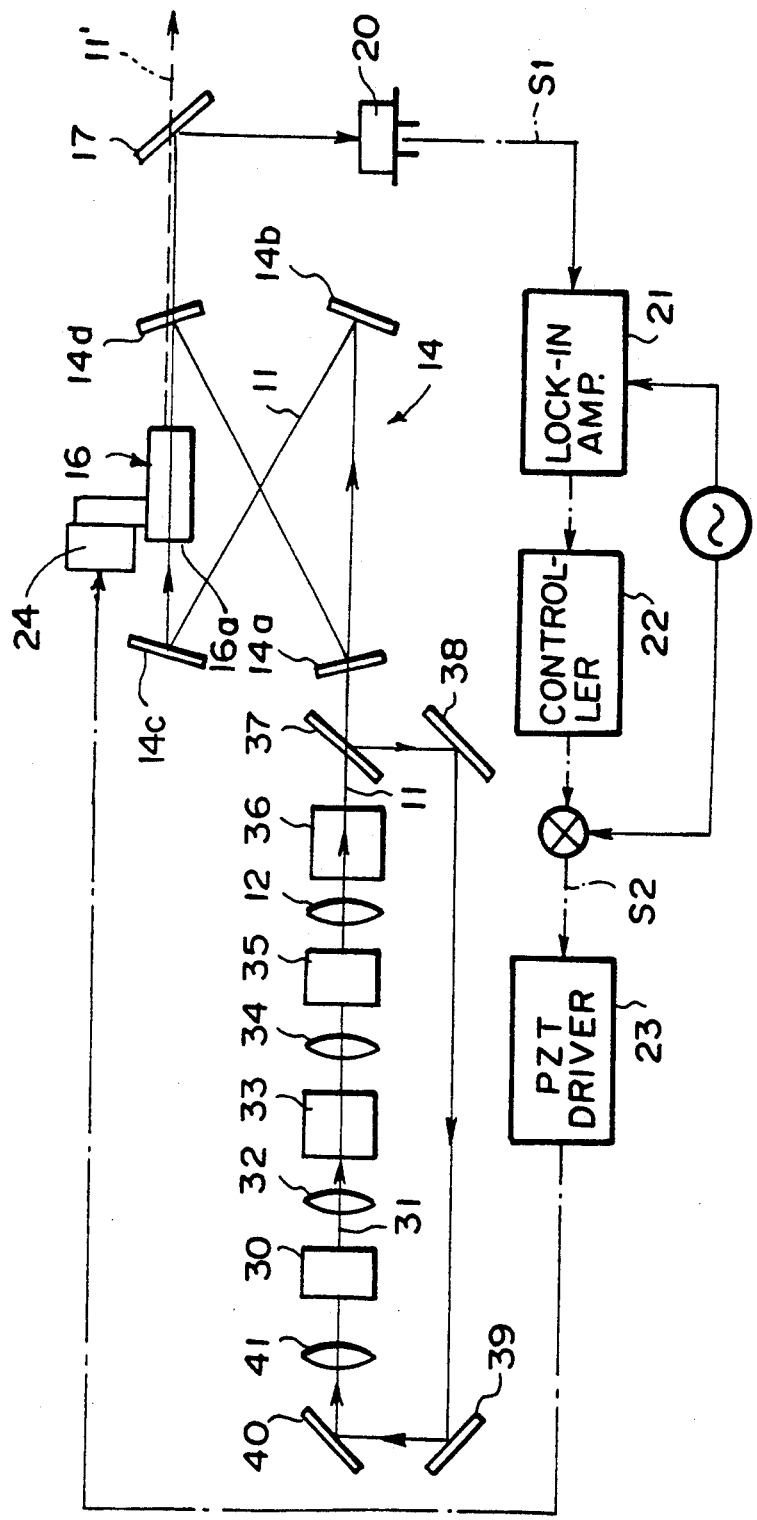
FIG. 2 is a schematic side view showing a second embodiment of the optical wavelength converting apparatus in accordance with the present invention.

A second embodiment of the optical wavelength converting apparatus in accordance with the present invention will be described hereinbelow with reference to FIG. 2.

In the second embodiment, a single-longitudinal-mode semiconductor laser 30 having an output power of 50 mW is employed for the purposes of injection locking. The single-longitudinal-mode semiconductor laser 30 produces a laser beam 31 having a wavelength of 860 nm. The laser beam 31 is collimated by a collimator lens 32 and passes through an isolator 33 for preventing the laser beam 31 from returning to the semiconductor laser 30. Thereafter, the laser beam 31 is condensed by a condensing lens 34 and injected into a phased array laser 35. When the phased array laser 35 is in the free running state, it has a plurality of longitudinal modes over a wavelength range of 859 nm to 861 nm. However, as the laser beam 31 is injected into the phased array laser 35, the phased array laser 35 is brought to the single longitudinal mode, and its oscillation wavelength becomes 860 nm alone. The output power of the phased array laser 35 is 1W, which is sufficiently higher than the output power of the single-longitudinal-mode semiconductor laser 30 for injection locking.

How the oscillation wavelength of the single-longitudinal-mode semiconductor laser 30 for injection locking is prevented from fluctuating will be described hereinbelow. An isolator 36 and a semi-transparent mirror 37 are located in the optical path of the fundamental wave 11 between the collimator lens 12 and the ring resonator 14. In the same manner as that in the first embodiment described above, part of the fundamental wave 11, which has been resonated by the ring resonator 14, passes through the mirror 14a for partially transmitting the fundamental wave 11 and returns toward the phased array laser 35. Part of the fundamental wave 11 thus returning is reflected by the semi-transparent mirror 37, and the remainder of the fundamental wave 11 passes therethrough. The fundamental wave 11, which has thus passed through the semi-transparent mirror 37, is blocked by the isolator 36 and is thereby prevented from returning to the phased array laser 35.

The fundamental wave 11, which has been reflected by the semi-transparent mirror 37, is then reflected by mirrors 38, 39, and 40. Thereafter, the fundamental wave 11 is condensed by a condensing lens 41 and fed back to the single-longitudinal-mode semiconductor laser 30. Therefore, the oscillation frequency of the single-longitudinal-mode semiconductor laser 30 (i.e., the wavelength) is brought to the resonance frequency of the ring resonator 14, and the oscillation wavelength is thereby prevented from fluctuating.

Accordingly, a fundamental wave 11 can be obtained which has been brought to the single longitudinal mode and which has a sufficiently high intensity and free of any fluctuation in the wavelength. As a result, a second harmonic 11' in the single longitudinal mode can be obtained which has a high intensity and which is stable. In this case, the output power of the second harmonic 11' having the wavelength of 430 nm is 100 mW.

In the second embodiment, the fundamental wave 11, which has been reflected by the dichroic mirror 17, is utilized to carry out the control for stabilizing the feedback of the fundamental wave 11 to the single-longitudinal-mode semiconductor laser 30. The control is carried out in the same manner as that in the first embodiment described above.

In the aforesaid embodiments, the second harmonic of the fundamental wave is generated. The optical wavelength converting apparatus in accordance with the present invention is also applicable when a fundamental wave is converted into its third harmonic and when fundamental waves are converted into a wave having a frequency equal to the difference between or the sum of the frequencies of the fundamental waves.

What is claimed is:

1. An optical wavelength converting apparatus comprising:
   i) a multiple longitudinal mode semiconductor laser,
   ii) an external resonator for resonating a laser beam, which has been radiated out of said semiconductor laser and which serves as a fundamental wave,
   iii) an optical wavelength converting device located in an optical path of the fundamental wave, which has been resonated by said external resonator, and
   iv) a means for feeding part of said fundamental wave, which has been resonated by said external resonator, back to said semiconductor laser.

2. An apparatus as defined in claim 1 wherein said multiple longitudinal mode semiconductor laser, is selected from the group consisting of a broad area laser and a phased array laser.

3. An apparatus as defined in claim 1 wherein said laser beam, which serves as said fundamental wave, is converted into its second harmonic.

4. An optical wavelength converting apparatus comprising:
   i) a semiconductor laser, which is capable of oscillating in a multiple longitudinal mode,
   ii) an external resonator for resonating a laser beam, which has been radiated out of said Semiconductor laser and which serves as a fundamental wave,
   iii) an optical wavelength converting device located in an optical path of the fundamental wave, which has been resonated by said external resonator,
   iv) a single-longitudinal-mode semiconductor laser for producing a laser beam for injection locking, which laser beam impinges upon said semiconductor laser capable of oscillating in the multiple longitudinal mode, and
   v) a means for feeding part of said fundamental wave, which has been resonated by said external resonator, back to said single-longitudinal-mode semiconductor laser.

5. An apparatus as defined in claim 4 wherein said semiconductor laser, which is capable of oscillating in a multiple longitudinal mode, is selected from the group consisting of a broad area laser and a phased array laser.

6. An apparatus as defined in claim 4 wherein said laser beam, which serves as said fundamental wave, is converted into its second harmonic.

* * * * *